(12) United States Patent
Soe et al.

(10) Patent No.: US 10,476,486 B2
(45) Date of Patent: Nov. 12, 2019

(54) DIRECT COUPLED BIASING CIRCUIT FOR HIGH FREQUENCY APPLICATIONS

(71) Applicant: Tensorcom, Inc., Carlsbad, CA (US)

(72) Inventors: Zaw Soe, Encinitas, CA (US);
KhongMeng Tham, San Diego, CA (US)

(73) Assignee: NantWorks, LLC, Culver City, CA (US)

( * ) Notice: Subject to any disclaimer, the term of this patent is extended or adjusted under 35 U.S.C. 154(b) by 0 days.

(21) Appl. No.: 15/646,776

(22) Filed: Jul. 11, 2017

(65) Prior Publication Data

US 2017/0310308 A1 Oct. 26, 2017

Related U.S. Application Data

(63) Continuation of application No. 14/828,955, filed on Aug. 18, 2015, now Pat. No. 9,792,880, which is a
(Continued)

(51) Int. Cl.
*H03K 3/012* (2006.01)
*H03K 17/56* (2006.01)
(Continued)

(52) U.S. Cl.
CPC ............. *H03K 3/012* (2013.01); *G05F 3/16* (2013.01); *H01Q 1/50* (2013.01); *H03K 17/56* (2013.01); *H04B 5/0075* (2013.01)

(58) Field of Classification Search
CPC ..... G05F 3/02; G05F 3/06; G05F 3/16; G05F 3/30; G05F 3/24; H03K 3/012;
(Continued)

(56) References Cited

U.S. PATENT DOCUMENTS 5,525,871 A 6/1996 Bray et al.
6,300,837 B1 10/2001 Sowlati et al.
(Continued)

FOREIGN PATENT DOCUMENTS

JP H0754888 A 2/1995

OTHER PUBLICATIONS

Chinh H. Doan, Sohrab Emami, Ali M. Niknejad, Robert W. Brodersen, "Design of CMOS for 60GHz Applications", Session 24.4, Feb. 18, 2004, IEEE International Solid-State Circuits Conference, San Francisco, CA.
(Continued)

*Primary Examiner* — Gustavo A Rosario-Benitez
(74) *Attorney, Agent, or Firm* — Mintz Levin Cohn Ferris Glovsky and Popeo, P.C.

(57) ABSTRACT

This invention eliminates the need for "capacitor coupling" or "transformer coupling," and the associated undesirable parasitic capacitance and inductance associated with these coupling techniques when designing high frequency (~60 GHz) circuits. At this frequency, the distance between two adjacent stages needs to be minimized. A resonant circuit in series with the power or ground leads is used to isolate a biasing signal from a high frequency signal. The introduction of this resonant circuit allows a first stage to be "directly coupled" to a next stage using a metallic trace. The "direct coupling" technique passes both the high frequency signal and the biasing voltage to the next stage. The "direct coupling" approach overcomes the large die area usage when compared to either the "AC coupling" or "transformer coupling" approach since neither capacitors nor transformers are required to transfer the high frequency signals between stages.

18 Claims, 7 Drawing Sheets

Related U.S. Application Data continuation of application No. 13/163,562, filed on Jun. 17, 2011, now Pat. No. 9,143,204.

(51) Int. Cl.
*H01Q 1/50* (2006.01)
*H04B 5/00* (2006.01)
*G05F 3/16* (2006.01)

(58) Field of Classification Search
CPC ...... H03K 17/56; H03K 5/145; H04B 5/0075; H01Q 1/50
See application file for complete search history.

(56) References Cited

U.S. PATENT DOCUMENTS

| | | |
|---|---|---|
| 6,331,799 B1 | 12/2001 | Miyazawa |
| 6,495,997 B2 | 12/2002 | Hall et al. |
| 6,859,103 B2 | 2/2005 | Yeh |
| 6,873,211 B1 | 3/2005 | Thompson et al. |
| 7,026,802 B2 | 4/2006 | Gradinariu |
| 7,446,612 B2 | 11/2008 | Fisher et al. |
| 7,741,912 B1 * | 6/2010 | Nadimpalli ........... H03F 1/0261 330/285 |
| 2001/0020872 A1 | 9/2001 | Miyazawa |
| 2001/0045867 A1 | 11/2001 | Miyashita et al. |
| 2002/0017954 A1 | 2/2002 | Hau et al. |
| 2004/0251966 A1 | 12/2004 | Yeh |
| 2005/0147136 A1 | 7/2005 | Pobanz |
| 2005/0179484 A1 | 8/2005 | Sasho et al. |
| 2006/0061425 A1 * | 3/2006 | Arigliano ............... H03B 5/364 331/36 C |
| 2006/0158257 A1 | 7/2006 | Fujimoto et al. |
| 2008/0290947 A1 * | 11/2008 | Dawe ........................ H03F 1/56 330/282 |
| 2009/0079524 A1 | 3/2009 | Cyr et al. |
| 2009/0189577 A1 | 7/2009 | Lin et al. |
| 2009/0201052 A1 | 8/2009 | Sanduleanu et al. |
| 2009/0218996 A1 | 9/2009 | Kaplish |
| 2009/0289702 A1 | 11/2009 | Hsieh |
| 2010/0079196 A1 | 4/2010 | Stienbrecher |
| 2010/0109770 A1 | 5/2010 | Belot et al. |
| 2010/0255792 A1 | 10/2010 | Maloudi |
| 2011/0133838 A1 * | 6/2011 | Paul ........................ H03F 1/086 330/259 |

OTHER PUBLICATIONS

Scott Reynolds, Brian Floyd, Ullrich Pfeiffer, Thomas Zwick, "60GHz Transceiver Circuits in SiGe Bipolar Technology", Session 24.5, Feb. 18, 2004, IEEE International Solid-State Circuits Conference, San Francisco, CA.

Brian Floyd, Scott Reynolds, Ullrich Pfeiffer, Troy Beukema, Janusz Grzyb, Chuck Haymes, "A Silicon 60GHz Receiver and Transmitter Chipset for Broadband Communications", Session 10.3, Feb. 7, 2006, IEEE International Solid-State Circuits Conference, San Francisco, CA.

Chi-Hsueh Wang, Yi-Hsien Cho, Chin-Shen Lin, Huei Wang, Chun-Hsiung Chen, Dow-Chih Niu, John Yeh, Chwan-Ying Lee, John Chern, "A 60GHz Transmitter with Integrated Antenna in 0.18 μm SiGe BiCMOS Technology", Session 10.4, Feb. 7, 2006, IEEE International Solid-State Circuits Conference, San Francisco, CA.

Stephane Pinel, Saikat Sarkar, Padmanava Sen, Bevin Perumana, David Yeh, Debasis Dawn, Joy Laskar, "A 90nm CMOS 60GHz Radio", Session 6.8, Feb. 4, 2008, IEEE International Solid-State Circuits Conference, San Francisco, CA.

Masahiro Tanomura, Yasuhiro Hamada, Shuya Kishimoto, Masaharu Ito, Naoyuki Orihashi, Kenichi Maruhashi, Hidenori Shimawaki, "TX and RX Front-Ends for 60GHz Band in 90nm Standard Bulk CMOS", Session 31.1, Feb. 6, 2008, IEEE International Solid-State Circuits Conference, San Francisco, CA.

Jie-Wei Lai, Alberto Valdes-Garcia, "A 1V 17.9dBm 60GHz Power Amplifier in Standard 65nm CMOS", Session 23.6, Feb. 10, 2010, IEEE International Solid-State Circuits Conference, San Francisco, CA.

Chi Y Law, Anh-Vu Pham, "A High-Gain 60GHz Power Amplifier with 20dBm Output Power in 90nm CMOS", Session 23.7, Feb. 10, 2010, IEEE International Solid-State Circuits Conference, San Francisco, CA.

Cristian Marcu, Debopriyo Chowdhury, Chintan Thakkar, Ling-Kai Kong, Maryam Tabesh, Jung-Dong Park, Yanjie Wang, Bagher Afshar, Abhinav Gupta, Amin Arbabian, Simone Gambini, Reza Zamani, Ali M. Niknejad, Elad Alon, "A 90nm CMOS Low-Power 60GHz Transceiver with Integrated Baseband Circuitry", Session 18.5, Feb. 10, 2009, IEEE International Solid-State Circuits Conference, San Francisco, CA.

Wei L. Chan, John R. Long, Marco Spirito, John J. Pekarik, "A 60GHz-Band 1V 11.5dBm Power Amplifier with 11% PAE in 65nm CMOS", Session 24.4, Feb. 11, 2009, IEEE International Solid-State Circuits Conference, San Francisco, CA.

Wei L. Chan, John R. Long, Marco Spirito, John J. Pekarik, "A 60GHz-Band 2×2 Phased-Array Transmitter in 65nm CMOS", Session 2.3, Feb. 8, 2010, IEEE International Solid-State Circuits Conference, San Francisco, CA.

47 CFR § 15.257 Operation within the band 57-64 GHz.

* cited by examiner

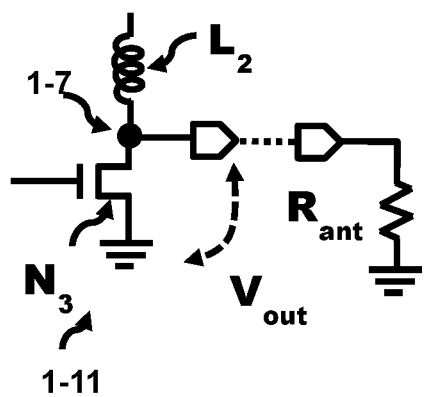
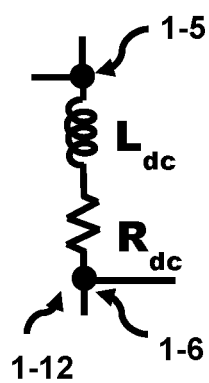
FIG. 1c  FIG. 1d
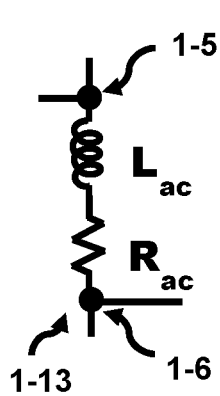
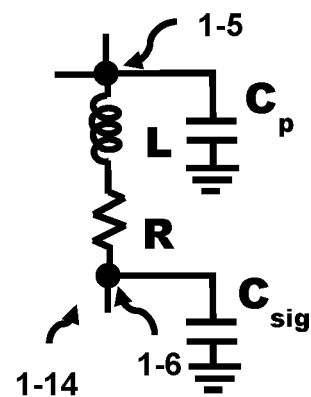
FIG. 1e  FIG. 1f

DIRECT COUPLED BIASING CIRCUIT FOR HIGH FREQUENCY APPLICATIONS

RELATED APPLICATIONS

This application is a Continuation of U.S. patent application Ser. No. 14/828,955, filed on Aug. 18, 2015, which is a Continuation of U.S. patent application Ser. No. 13/163,562, filed on Jun. 17, 2011, now U.S. Pat. No. 9,143,204, which is incorporated by reference in its entirety.

BACKGROUND OF THE INVENTION

The Federal Communications Commission (FCC) has allotted a spectrum of bandwidth in the 60 GHz frequency range (57 to 64 GHz). Integrated circuits, formed in semiconductor die, offer high frequency operation in this millimeter wavelength range of frequencies. Some of these integrated circuits utilize Complementary Metal Oxide Semiconductor (CMOS) or Silicon-Germanium (SiGe) technology to form the dice in these designs. At 60 GHz, short on-chip metallic traces translate to inductance values that impact the design of these high frequency circuits. The approximate parasitic inductance of metallic trace in an integrated circuit at this frequency is of the order of 1 pH per micrometer of trace length (2-4 um trace width and 0.85-3 um thickness). At 60 GHz, a typical inductor has an inductance on the order of about 50 to 120 pH and, for one example case, occupies a die area of about 100 um on a side At these high frequencies (~60 GHz), there are essentially two approaches to transferring signals between stages. Both approaches use reactive devices. These approaches are known as "AC coupling" and "transformer coupling." The reactive devices that are used in these two approaches tend to use up more die area than the active devices within the stage themselves.

In the "AC coupling" approach, (for example, see: Chinh H. Doan, Sohrab Emami, Ali M. Niknejad, Robert W. Brodersen, "Design of CMOS for 60 GHz Applications", Session 24.4, Feb. 18, 2004, IEEE International Solid-State Circuits Conference, San Francisco, Calif.) the signals between stages are transferred through a series capacitor coupled between a first stage and the next stage. The capacitor blocks the DC operating voltages of the first stage from affecting the DC operating conditions of the next stage. This technique allows each stage to be DC biased independently of each other; however, the AC component of the signal is transferred between stages through the capacitor. Forming this capacitor on an integrated circuit also introduces an undesired and unavoidable parasitic capacitance to ground, power and die (substrate). This reduces the efficiency and increases the power dissipation of the "AC coupling" approach. A typical coupling capacitor at 60 GHz can range from 200 fF to 500 fF and, for one example case, would have a dimension of 40 um by 40 um.

The second approach uses "transformer coupling" (for example, see: Wei L. Chan, John R. Long, Marco Spirito, John J. Pekarik, "A 60 GHz-Band 1V 11.5 dBm Power Amplifier with 11% PAE in 65 nm CMOS", Session 24.4, Feb. 11, 2009, IEEE International Solid-State Circuits Conference, San Francisco, Calif.) between stages to transfer the signals between the first stage and the next stage. Transformers have large dimensions on a die and are typically used in a balanced signal configuration. Transformers typically have a large parasitic capacitance. The active devices and balanced networks resonate out the parasitic capacitance of the transformer. However, transformers suffer skin loss, coupling loss and die (or substrate) loss. The balanced configuration requires the generation of two signals 180° out of phase with each other. This increases the power dissipation of this approach since there are twice the stages over that of the "AC coupling" approach. The metallic traces form the lower and upper coils of the transformer that are separated by an oxide and typically overlay one over the other to increases the coupling coefficient (~0.9) in the transformer. The lower side of the lower coil, the top side of the upper coil and the sides of the coils have stray capacitance. This reduces the efficiency and increases the power dissipation of the "transformer coupling" approach. One typical transformer at 60 GHz could have a dimension of 80 um by 80 um. The transformers uses about 4 times more die area then the coupling capacitors.

One of the disadvantages of the coupling capacitor and coupling transformer methods is their very large physical size, which translate to larger die area and increased cost. Also, due to the large area of these reactive components, the length of the trace to interconnect the first stage to the next stage through the reactive component increases. Since each micrometer of trace has 1 pH of inductance and the dimensions of the reactive devices are on the order of a 100 um length, the parasitic inductance and capacitance could significantly alter the desired load inductance and capacitance.

In addition to these disadvantages, CMOS foundries typically do not provide models or guarantee that the coupling capacitor and transformer modeling for circuits operating more than 20 GHz. This presents a very significant challenge and difficulties to companies without a modeling group and high frequency measuring equipment. This requires that the Radio Frequency (RF) designer to carefully study and analyze the physical layout of their circuit in a given technology without the advantage of these models or the behavior of the circuit at 60 GHz. The additional time needed to perform this analysis increases the length of time to generate the final mask levels for the given technology (known as "tapeout") and opens the potential for lost revenue.

BRIEF SUMMARY OF THE INVENTION

In accordance with one aspect of the invention, a resonant circuit is used to isolate a biasing signal from a high frequency signal. The introduction of this resonant circuit in series with the power or ground leads, allows a first stage to be "directly coupled" to a next stage using a metallic trace. The "direct coupling" approach overcomes the wasteful use of die area as described previously for the "AC coupling" or "transformer coupling" approaches used in the high frequency (~60 GHz) circuit designs since neither capacitors nor transformers are required to transfer the signals between stages. This "direct coupling" invention minimizes the distance between stages by directly coupling and transferring a biasing signal from the first stage to the next stage over the metallic trace connecting these points. In addition, a high frequency signal is also transferred from the first stage to the next stage over the same metallic trace. In the first stage, a resonant circuit in the power supply lead is used to isolate a biasing signal from the high frequency signal. The resonant circuit passes the biasing signal unto the metallic trace carrying the high frequency signal but blocks the high frequency (~60 GHz) signals on the metallic trace from affecting the biasing signal. This biasing signal is used to accurately control the power drive characteristics of the next stage.

In another illustrative embodiment, a reference current source is applied to a transistor connected in saturation. As the reference current source is adjusted, a voltage reference circuit controlled by the current source creates a biasing voltage that is applied to the resonant circuit. The biasing voltage passes through the resonant circuit of the first stage and combines with the high frequency (~60 GHz) signals on the metallic trace to the next stage. The biasing voltage signal contains information to adjust the parameters of the next stage. For example, the next stage's drive strength is controlled by manipulating the magnitude of the reference current source. The drive strength control is proportional to the width of the active device in the next stage ($N_3$) to the width of the reference transistor ($N_1$) times the magnitude of the reference current source. Thus, the output power of the next stage is carefully controlled by adjusting the magnitude of the reference current source. The current in the next stage scales in direct proportion with the reference current source thereby controlling the power drive characteristics of the next stage. Thus, the characteristics of the next stage, such as: power control, current flow, and accurate biasing of the next stage can be controlled by adjusting the DC biasing.

The reference current source is applied to an variable width transistor connected in saturation. The width of the transistor is adjusted to alter the biasing voltage. The biasing voltage passes through the resonant circuit of the first stage and is applied to the next stage. The biasing voltage signal carries information concerning the width of the transistor and adjusts the parameters of the next stage. One of the parameters adjusted is the power control of the next stage which, for example, can be the "final stage" of a power stage to drive an antenna. A voltage reference circuit controlled by the variable width transistor creates a dependent biasing voltage that is applied to one end of the resonant circuit of the first stage. The biasing voltage passes through the resonant circuit and combines with the high frequency (~60 GHz) signals on the metallic trace. The variable width transistor in the biasing voltage is used to control a behavior of the next stage. The drive strength of the next stage is controlled by manipulating the width of the reference transistor. The control is proportional to the width of the active device in the next stage with respect to the width of the reference transistor times the magnitude of the reference current source. Thus, the output power of the next stage is carefully controlled by adjusting the reference transistor width.

Another embodiment of one of the present inventions is an apparatus comprising: a second transistor scaled to a first transistor by a value; a first current through the first transistor generates a first biasing voltage; a control loop monitors the first biasing voltage and generates a second biasing voltage; and a first resonant parallel LC load directly couples the second biasing voltage to an input of the second transistor to control a second current through the second transistor, whereby the second current is scaled to the first current by the value, whereby the first transistor is connected in saturation, whereby the second biasing voltage is substantially equal to the first biasing voltage, further comprising: an output of a third transistor directly coupled to the first resonant parallel LC load; a second resonant parallel LC load directly couples a power supply to an output of the second transistor; an input signal coupled to the input of the second transistor that generates an intermediate signal at the output of the second transistor; and the intermediate signal directly coupled to an input of the third transistor, whereby the LC loads comprise parasitic and non-parasitic capacitance and inductance components, and parasitic resistance, whereby the intermediate signal combines with the second biasing voltage at the output of the third transistor and is directly coupled to the input of the second transistor to generate an output signal at the output of the second transistor, whereby the LC loads resonate at a frequency to select a frequency band within an allotted spectrum, whereby the first current is adjustable, a width of the first transistor is adjustable or both are adjustable.

Another embodiment of one of the present inventions is an apparatus comprising: adjustable biasing voltage coupled through a first resonant parallel LC load of a first stage to an output of the first stage; the output of the first stage is directly coupled to an input of a next stage; and at least one characteristic of the next stage is controlled by the adjustable biasing voltage, further comprising: a first transistor that generates the adjustable biasing voltage; and a second transistor in the next stage, whereby the first transistor is a scaled version of the second transistor, whereby the characteristic is a current through the next stage or a power output of the next stage, further comprising: a second resonate parallel LC load directly couples a power supply to an output of the next stage; and an input signal coupled to an input of a first stage generates an intermediate signal at the output of the first stage, whereby the intermediate signal is directly coupled to the input of the next stage, whereby the parallel LC loads comprise parasitic and non-parasitic capacitance and inductance components, and parasitic resistance, whereby the LC loads resonate at a frequency to select a frequency band within an allotted spectrum. The apparatus further comprising: an output signal at the output of the next stage, whereby the intermediate signal combines with the second biasing voltage at the output of the first stage and is directly coupled to the input of the next stage to generate the output signal, further comprising: a current source or current sink generating a first current; a first transistor in saturation; and a second biasing voltage formed across the first transistor due to the first current flowing through the first transistor, further comprising: a control loop that monitors the second biasing voltage and generates the adjustable biasing voltage.

Another embodiment of one of the present inventions is a method of controlling a current in a final stage comprising the steps of: applying a reference biasing voltage to a control loop; using the control loop to generate a first biasing voltage; coupling the first biasing voltage through a first resonant parallel LC load directly to an output of a first stage; combining an intermediate signal at the output of the first stage directly with the first biasing voltage; coupling the intermediate signal with the first biasing voltage directly to an input of the final stage; and adjusting the first biasing voltage, thereby controlling the current in the final stage, further comprising the steps of: a second resonant parallel LC load between a power supply and an output of a final stage; and coupling the output of the final stage to a driven load, whereby the driven load comprises at least one antenna.

Another embodiment of one of the present inventions is an apparatus comprising: an operational stage of a control loop compares a second biasing voltage to a reference voltage; a first current through a first transistor generates the reference voltage, whereby the first current is adjustable and the control loop equalizes the second biasing voltage to the reference voltage; a first parallel LC load directly couples the second biasing voltage to a gate of a second transistor to control a second current through the second transistor; and the second transistor scaled to the first transistor by a value, whereby the second current is scaled to the first current by the value, whereby the operational stage uses negative feedback to form the control loop, whereby the operational stage uses positive feedback to form the control loop eliminating the requirement of a compensation network for the operational stage, further comprising: a second parallel LC load directly couples a power supply to an output of the second transistor; and an input signal coupled to an input of a first stage generates an intermediate signal at the output of the first stage, whereby the intermediate signal is directly coupled to the gate of the second transistor, whereby the first current adjusts the gain of the second transistor, whereby the LC loads resonate at a frequency to select a frequency band within an allotted spectrum, further comprising: an output signal at the output of the second transistor, whereby the intermediate signal combines with the second biasing voltage at the gate of the second transistor to generate the output signal.

BRIEF DESCRIPTION OF THE DRAWINGS

Please note that the drawings shown in this specification may not be drawn to scale and the relative dimensions of various elements in the diagrams are depicted schematically and not to scale.

FIG. 1c depicts the output of the stage coupled to a load in accordance with the present invention.

FIG. 1d shows a portion of an equivalent circuit of the resonant circuit in accordance with the present invention.

FIG. 1e presents a portion of a second equivalent circuit of the resonant circuit in accordance with the present invention.

FIG. 1f illustrates an equivalent circuit of the resonant circuit in accordance with the present invention.

DETAILED DESCRIPTION OF THE INVENTION

This invention has been incorporated into a Power Stage (PA) design for a 60 GHz wireless system. The inventive apparatus is applicable to any high frequency system, for example, where the parasitic inductance of a metallic trace is of the order 1 pH per micrometer. At 60 GHz, the typical inductance within or between stages is on the order of about 50 to 120 pH. The actual dimensions of the capacitor depends on several issues; the type of capacitor, the overall positive reactance in a given stage that requires compensation; and, the physical layout of the capacitor, for example. At these frequencies, as a signal is coupled from the first stage to the next stage, the parasitic capacitance and/or the parasitic inductance of the coupling circuits is critical and needs to be minimized. This invention eliminates the need for "capacitor coupling" or "transformer coupling," and along with them, the associated undesirable parasitic capacitance and inductance. In this invention, the signal from the first stage is directly coupled to the next stage.

Figure 1A:
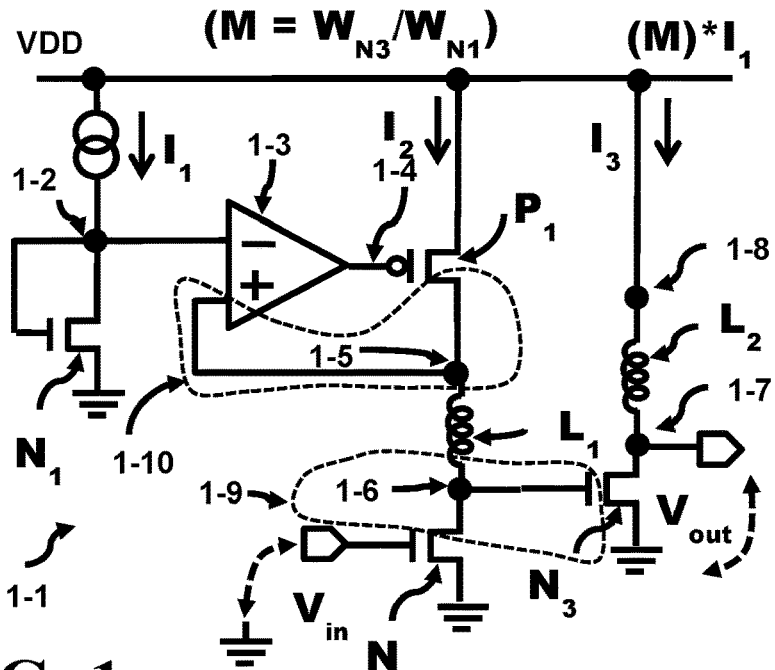
FIG. 1a depicts one embodiment of the direct biasing technique using a first operational amplifier stage in accordance with the present invention.

FIG. 1a illustrates one embodiment of the inventive circuit 1-1 and will first be described under DC conditions. Assume that the inductor $L_1$ has a very low resistance causing the voltage at node 1-5 to nearly equal the voltage at node 1-6. Devices $N_1$ and $N_3$ are scaled versions of each other and are well matched. In order to simply the description of the invention, assume that the gate length and oxide thickness of the devices will remain constant while the gate width, W, is adjusted to scale the sizes of matched devices. A second device can be scaled to a first device by a value. For example, if the second device has a width of 100 um and the first device has a width of 10 um, then the second device is scaled to the first device by a value of 10×. The device nomenclature for the $N_2$ and $P_1$ devices imply an N-channel and P-channel MOS (Metal Oxide Semiconductor) device, respectively. The gate width of device $N_3$ is scaled M times larger (M times the width of $N_1$) than the device $N_1$. A bias current of $I_1$ flows through the diode connected $N_1$ device (gate connected to its drain) which provides the gate voltage at node 1-2. An operational amplifier stage 1-3 monitors this voltage on its negative input. The output 1-4 of the operational amplifier stage is applied to the gate of device $P_1$. The drain 1-5 of $P_1$ is connected to the positive input of operational amplifier stage 1-3. The operational amplifier stage 1-3 and the device $P_1$ form a control loop causing the voltage at node 1-5 to be forced to the voltage at node 1-2. Furthermore, the DC biasing voltage at node 1-2 (gate voltage of $N_1$) can range from 700 to 900 mV. The drain current of $N_2$ ($I_2$) is set to about 10 mA and since the DC resistance of the inductor $L_1$ is about 2Ω, the total DC voltage drop across the inductor $L_1$ is about 20 mV. This DC voltage drop across the inductor $L_1$ between nodes 1-5 and 1-6 is about 2% of the desired DC biasing voltage. Thus, the voltage at node 1-5 is essentially equal to voltage at node 1-6, the gate voltage of $N_3$ becomes essentially equal to the voltage on node 1-2 which is also the gate voltage of $N_1$. Since devices $N_1$ and $N_3$ are well matched devices and the gate voltages of $N_1$ and $N_3$ are equal, the current $I_3$ through $N_3$ is then M times that of current through device $N_1$, or $I_3=M*I_1$, where $M=(W_{N3}/W_{N1})$, $W_{N3}$ is the width of device $N_3$ and $W_{N1}$ is the width of device $N_1$. The current $I_3$ is supplied by VDD 1-8 and passed through the inductor $L_2$ to the drain of $N_3$, node 1-7. By this scheme, the current $I_3$ through the output device $N_3$ is controlled by adjusting the device size of $N_1$, programming the $I_1$ current source or performing both adjustments simultaneously. The current through the $N_2$ device is determined by its gate bias voltage of the input signal $V_{in}$. The output signal $V_{out}$ is available on node 1-7.

A very important advantage of this scheme is that the first stage ($N_2$) is "directly coupled" to the next stage ($N_3$) by the metallic trace between node 1-6 and the gate of $N_3$. The trace length between the node 1-6 and the gate of device $N_3$ is now determined by the design rules in a given technology regarding the minimum placement of adjacent devices in a layout. Thus, the parasitics of any resistances, inductances or capacitances on this node coupling these two stages has been reduced to the minimum possible for the given technology, thereby reducing any inter-stage coupling losses. Both the inductance and the capacitance are composed of a parasitic and non-parasitic component.

Recall that both "AC coupling" and "transformer coupling" introduce either a series capacitor or transformer in the trace between node 1-6 and the gate of $N_3$ or their equivalent. Both of these components consume large die area. For example, a typical transformer has side dimensions in the range of 80 by 80 um while the coupling capacitor would use about 4 times less area with side dimensions in the range of 40 by 40 um. Thus, the use of a directly coupled trace between node 1-6 and the gate of $N_3$ has advantages when compared to connecting node 1-6 to the gate of $N_3$ using either a transformer or a capacitor. Some of these advantages include: 1) a simple trace (metallic conductor) is used to transfer the signal from the drain of $N_2$ to the gate of $N_3$; 2) the same metallic conductor carries the DC biasing voltage to accurately control the behavior of $N_3$; 3) area consumption of high frequency coupling trace decreases to the minimum; 4) die size reduces; 5) cost of die decreases; 6) the parasitic inductance and parasitic capacitance of the short metallic conductor is reduced in complexity; 7) less power is dissipated (less parasitic capacitance/inductance is driven); 8) computation time to model metallic conductor decreases; and 9) simulation time of final layout decreases.

Figure 1B:
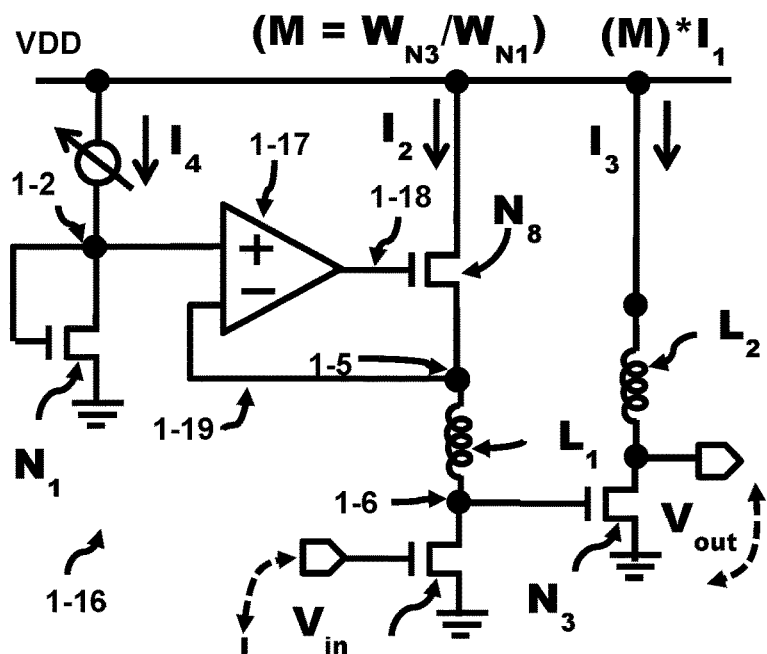
FIG. 1b illustrates a second embodiment of the direct biasing technique using a second operational amplifier stage in accordance with the present invention.

FIG. 1b depicts a second embodiment of the inventive circuit. The circuit is equivalent to the circuit in FIG. 1a except for the adjustable current source $I_4$, the second operational amplifier stage 1-17 and the device $N_8$. The adjustable current source $I_4$ is coupled to the N-channel $N_1$ with the gate connected to the drain 1-2 and applied to a positive input of the second operational amplifier stage 1-17. The control loop is formed by the second operational amplifier stage 1-17, the second operational amplifier stage output 1-18, the N-channel $N_8$ and the feedback path 1-19 to the negative terminal of the second operational amplifier stage. The adjustable current source $I_4$ is used to adjust the gain of the N-channel device $N_3$.

Figure 1G:
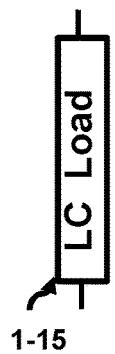
FIG. 1g shows a block diagram of FIG. 1f in accordance with the present invention.
Figure 1H:
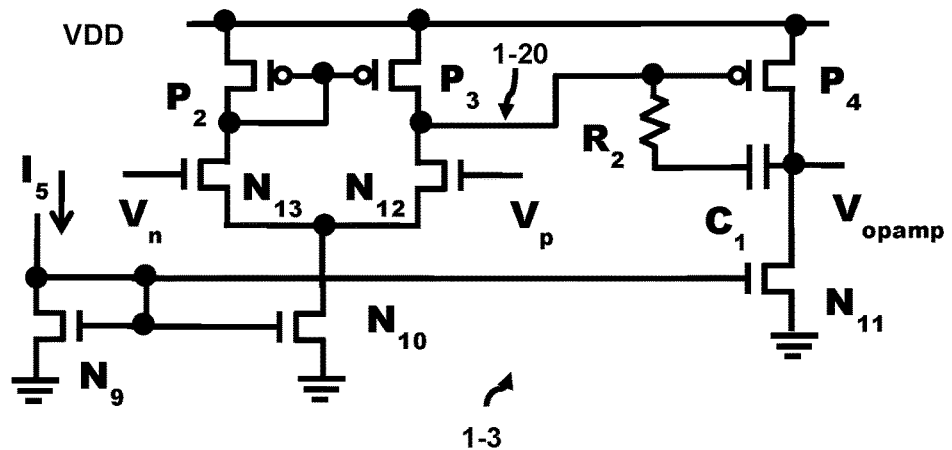
FIG. 1h presents the internal circuit of a first operational amplifier stage with compensation.

In FIG. 1a, note that the first operational amplifier stage 1-3 uses negative feedback to form the control loop to control the stability of the first operational amplifier stage 1-3. The control loop is formed by the first operational amplifier stage 1-3, the first operational amplifier stage output 1-4, the P-channel $P_1$ and the feedback path to the positive terminal of the first operational amplifier stage. FIG. 1h illustrates a compensation network composed of $R_2$ and $C_1$ required in the first operational amplifier stage 1-3 to maintain stability. In FIG. 1a, the gain at the output of the amplifier $V_{out}$ is very difficult to control at millimeter-wave frequencies. In the control loop, the P-channel device $P_1$ gives an additional phase shift, which must be compensated by adding a zero inside the operational amplifier stage 1-3. The compensation network limits the response time of the operational amplifier stage 1-3. A large compensation capacitor (~4 pF) and a 4KΩ resistor are required to overcome any stability concerns causing large time constants. The operational amplifier stage 1-3 in FIG. 1a and the device $P_1$ form a control loop causing the voltage at node 1-5 to be forced to the voltage at node 1-2 by negative feedback. Due to the large compensation capacitor, the response time of the operational amplifier stage is limited by the RC delay and can as long as 500 nsec.

Figure 1I:
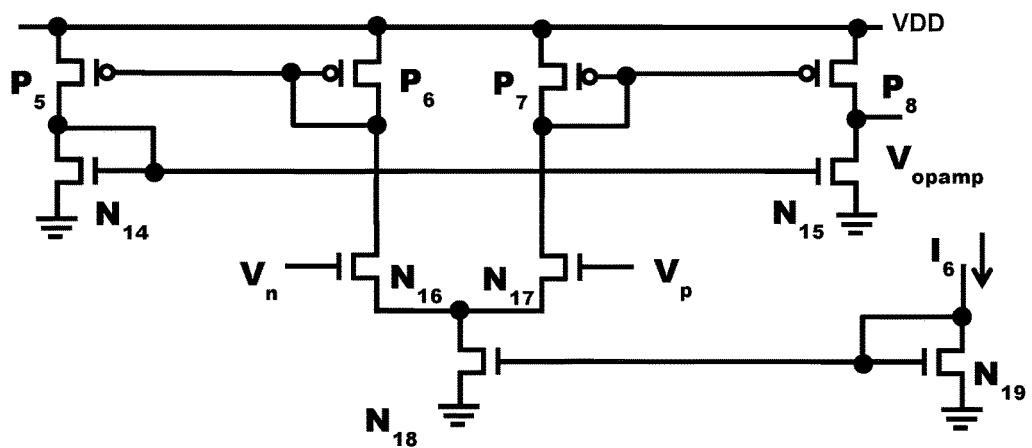
FIG. 1i illustrates the internal circuit of a second operational amplifier stage without compensation.

In FIG. 1b, however, the second operational amplifier stage 1-17 uses positive feedback to form the control loop since the P-channel device has been replaced by the N-channel device $N_8$. Use of the N-channel device does not required compensation, thus the response time is reduced and the gain control can be accomplished very quickly. Power can be saved if the gain control is fast since the final stage of the transmitter $N_3$ adjusts the gain on the order of 100 nsec. The second operational amplifier stage 1-17 is depicted in FIG. 1i. A compensation network is not required in the second operational amplifier stage 1-17. In FIG. 1b, the operational amplifier stage 1-17 and the device $N_8$ form a control loop causing the voltage at node 1-5 to equal the voltage at node 1-2 by positive feedback.

The N-channel $N_8$ in FIG. 1b eliminates a 180 phase shift in the feedback path 1-19 to the negative input of the operational amplifier stage since the node 1-5 now follows the output 1-18 of the operation stage 1-17 so there is no phase inversion. The stability issue of the control loop in FIG. 1b is eased to the point where the compensation capacitor is not required. Since this operational amplifier stage does not require feedback, the response time can be reduced to 100 nsec.

The internal circuit for the first operational amplifier stage 1-3 is illustrated in FIG. 1h. A current $I_5$ flows through the N-channel device $N_9$ providing a bias for current mirror devices $N_{10}$ and $N_{11}$. The current mirror devices $N_{10}$ and $N_{11}$ provide a current sink for a differential first stage composed of devices; $P_2$, $P_3$, $N_{13}$ and $N_{12}$ and the output driver device $P_4$, respectively. The negative input $V_n$ is applied to the gate of $N_{13}$ while the positive input $V_p$ is applied to the gate of $N_{12}$. The intermediate output 1-20 is then applied to the gate of device $P_4$. The compensation network couples the output of the first operational amplifier stage $V_{opamp}$ to node 1-20.

The internal circuit for the second operational amplifier stage 1-17 is illustrated in FIG. 1i. A current $I_6$ flows through the N-channel device $N_{19}$ and current mirror device $N_{18}$ provides a current sink for the differential first stage composed of devices; $P_6$, $P_7$, $N_{16}$ and $N_{17}$. The negative input $V_n$ is applied to the gate of $N_{16}$ while the positive input $V_p$ is applied to the gate of $N_{17}$. The intermediate outputs 1-21 and 1-22 are then applied to the gate of device $P_5$ and $P_8$, respectively. Both devices $P_6$ and $P_7$ have the drain coupled to their gate. The device $N_{14}$ generates the bias current control 1-23 for device $N_{15}$. The intermediate output 1-22 and the bias current control 1-23 are applied to the output devices $P_8$ and $N_{15}$, respectively, to generate the output of the second operational amplifier stage $V_{opamp}$. This circuit does use feedback internally; thus, the second operational amplifier stage 1-17 should respond quickly to gain changes in the inventive circuit of FIG. 1b.

In FIG. 1c, an example 1-11 of the output node $V_{out}$ of the next stage ("final stage") is shown connected to the load resistor $R_{ant}$ which can represent the impedance of at least one antenna. The high frequency signal is generated at node 1-7 and is routed on a metallic trace to a point on the die where the signal exits the die, $V_{out}$. In addition, the interconnect (dotted line) to the load $R_{ant}$ can comprise metallic trances, a bonding pad, bonding wire, a solder bump, package traces, interconnects, wires, transmissions lines, vias, etc. Each of these components introduce parasitic resistance, inductance and capacitance into the trace. The antenna, in some cases, may be fabricated on the same die thereby allowing greater control of the parasitics of the metallic trace. The inductor $L_2$, as will be discussed later, is a load that is set to resonate at 60 GHz.

Very simplified models are presented in FIG. 1d-f. These models, although basic, help present some of the features of the inventive idea. FIG. 1d shows the equivalent impedance of the inductor $L_1$ at DC. Since $Z_{L1}=j\omega L_{dc}=0$, (where $\omega=2\pi f$ and f is the frequency set equal to zero) the impedance of the inductor $L_{dc}$ is zero while the impedance of the resistor $R_{dc}$ would utilize the full cross-sectional area of the metallic trace to carry current (infinite skin depth), so that resistance is minimized at this point. FIG. 1e shows the equivalent impedance the inductor $L_1$ at some frequency f. When f>0, $Z_{L1}=j\omega L_{ac}$ and has a value greater than 0, but because of the skin effect, the impedance $R_{ac}$ increases as frequency increases. The skin depth is proportional to $f^{-1/2}$, and as f increases, the current is forced to flow closer to the outer cross-sectional area of the metallic trace presenting more resistance to the flow of the AC current (for instance, the skin depth in copper, Cu, is 0.27 um at f=60 GHz). Thus, when the DC signal and the AC signal are transferred though the metallic trace, the AC signal would experience the skin effect resistance and large reactance while the DC signal will experience the full cross-sectional area of the metallic trace and no reactance.

The capacitance connected to each end of the inductor $L_1$ within the dotted areas 1-9 and 1-10 of FIG. 1a has been added to the crude model as depicted in FIG. 1f. In FIG. 1f, the capacitance $C_p$ corresponding to the dotted region 1-10 comprises the capacitance of the input of the operation stage 1-3, the drain and miller capacitance of $P_1$, the near end capacitance of the inductor $L_1$, and any metallic trace capacitance. The capacitance $C_{sig}$ corresponding to the dotted region 1-9 comprises the capacitance of the drain and miller capacitance of device $N_2$, the gate capacitance and overlap capacitance of device $N_3$, the near end capacitance of the inductor $L_1$, and any metallic trace capacitance between node 1-6 and the gate of $N_3$. The nodes 1-6 and 1-7 transfer the signal provided at $V_{in}$ to the load $R_{ant}$. An intermediate signal is generated at 1-6 (the drain of $N_2$) by $V_{in}$. The intermediate signal is directly coupled from 1-6 to the gate of $N_3$. The output signal $V_{out}$ is generated at 1-7 (the drain of $N_3$) and is used to drive the load.

The circuit 1-14 in FIG. 1f models the load of $N_2$ and is a parallel LC circuit with resistive loss R. The capacitance across the inductor-resistor (L-R) circuit comprises the series connection of $C_p$ and $C_{sig}$, or $C_{eff}=(C_p*C_{sig})/(C_p+C_{sig})$. The capacitance $C_{sig}$ can be made dominant by significantly increasing the value of $C_p$ by the introduction of additional capacitance at node 1-5. The larger value capacitance also helps to stabilize the voltage at node 1-5 which is applied to the input of the operational amplifier stage 1-3. The components of the parallel LC circuit are designed to resonate at the frequency of interest (for example, 60 GHz). The resistor resistive loss R broadens the response.

The inductor $L_2$ would also have a similar model as that given in FIG. 1f. In the case of $L_2$, $C_p$ would be located at node 1-8. Since this is a lead for the power supply, the capacitance of the power supply traces and would be much larger than the capacitance $C_{sig}$ at node 1-7 ($V_{out}$). Similar techniques can be used for the complimentary circuit where all N-channels are replaced by P-channels and all P-channels are replaced by N-channels, power supplies VDD and VSS are flipped, and the circuit now presents the complement form.

One design illustrating the embodiment would adjust the inductor $L_1$ and $L_2$ such that the capacitance $C_{sig}$ on each node 1-6 or 1-7 resonates at the desired frequency of interest. Once the LC tank circuits resonate, their impedance is at maximum thereby isolating the high frequency signal at nodes 1-6 and 1-7 from the nodes on the other side of the two inductors 1-5 and 1-8. Furthermore, the impedance of the parallel LC tank circuit would also be the load for the devices $N_2$ and $N_3$.

Another design illustrating the embodiment would adjust the value of the capacitance $C_{sig}$ on each node 1-6 or 1-7 while minimizing changes to the inductors $L_1$ or $L_2$, respectively, such that both LC circuits resonate at the desired frequency of interest. Once both LC tank circuits resonate, their impedance is at maximum thereby isolating the high frequency signal at nodes 1-6 and 1-7 from the nodes 1-5 and 1-8 on the other side of the two inductors $L_1$ and $L_2$, respectively. Furthermore, the impedance of the parallel LC tank circuit would also be the load for the devices $N_2$ and $N_3$. A block diagram 1-15 of the LC circuit in FIG. 1f is illustrated in FIG. 1g.

In addition, another embodiment is to alter both the capacitances $C_{sig}$ and the inductor L1 and L2 simultaneously. In a resonating LC tank circuit, as the capacitance of C decreases, the inductance of L must increase to maintain the circuit in electrical resonance according to: $f=(2\pi(LC)^{1/2})^{-1}$.

Finally, another design illustrating the embodiment is to minimize both the inductance and the capacitance in both stages, thereby reducing the overall parasitic capacitance and resistance which then leads to a reduction in power dissipation. Then, each LC circuit is set to resonate at the desired frequency by increasing the inductance value of $L_1$ and $L_2$. This is done by increasing the physical length of the inductors $L_1$ and $L_2$ by linearly increasing their length or by using a circular or spiral pattern layout.

Figure 2A:
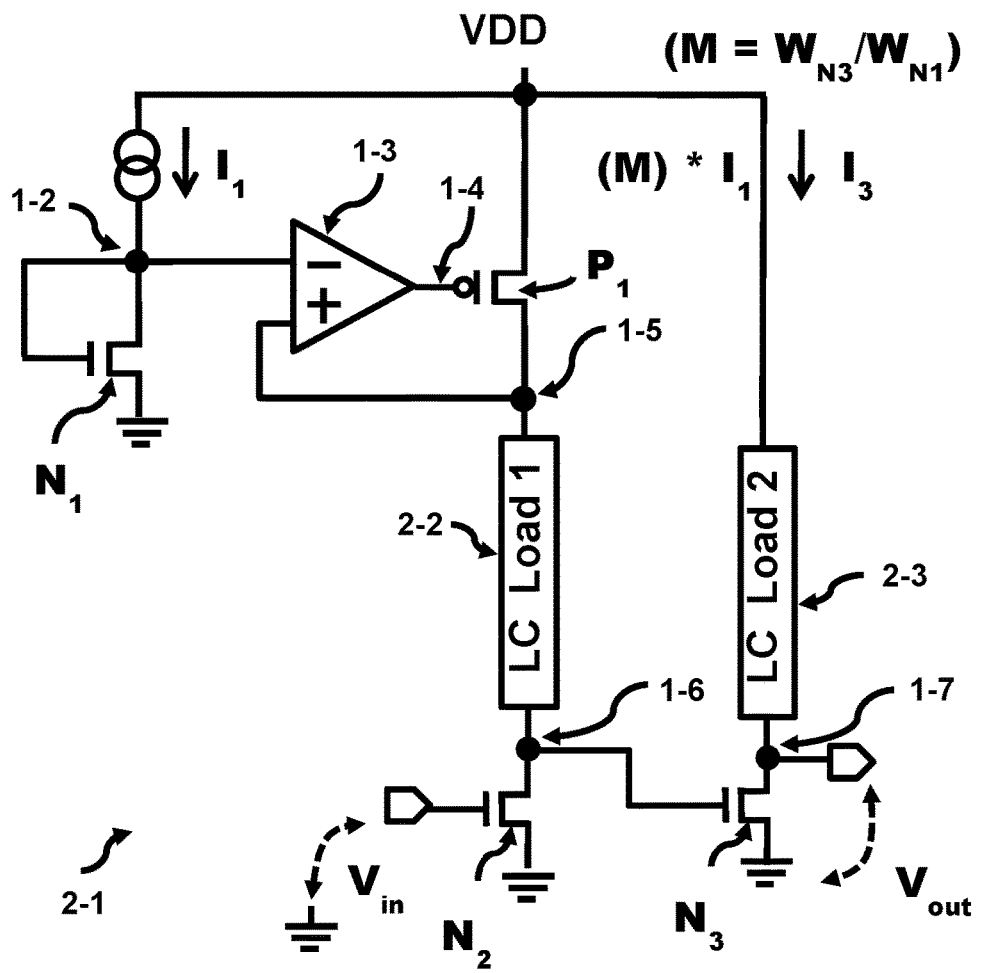
FIG. 2a illustrates the one embodiment of the direct biasing technique with the block diagram of FIG. 1e in accordance with the present invention.

FIG. 2a uses the block diagram 1-15 to simplify the circuit illustrated in FIG. 1a. The current $I_3$ can be adjusted by varying the size of the device $N_1$ where $I_3=(W_{N3}/W_{N1})*I_1$. Another method is by altering the value of the current $I_1$ in the programmable current source. Altering the current $I_1$ is straight forward and will not be covered since it is known in the art.

Figure 2B:
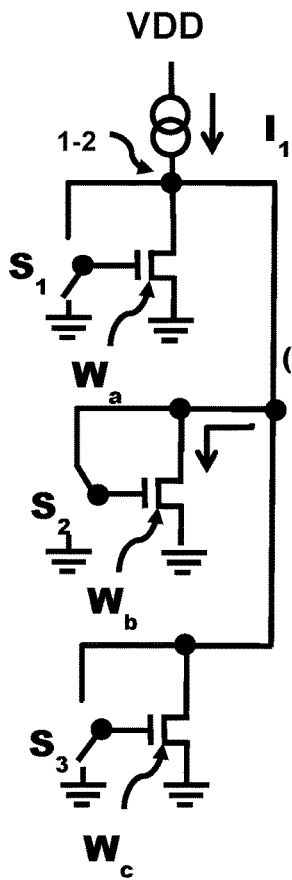
FIG. 2b shows a transistor size adjustment in accordance with the present invention.

The size of the device $N_1$ in FIG. 2a can be varied to adjust the current $I_3$, as illustrated in FIG. 2b. In FIG. 2b the N-channel transistors identified by their channel widths. The summation of the widths of the devices $W_a$, $W_b$ and $W_c$ in FIG. 2b equals $W_{N1}$, since the width of the initial device $I_3$ is $W_{N1}$. One embodiment of a circuit to adjust the size of $N_1$ is illustrated in FIG. 2b. Thus, if all devices are enabled (all switches connected to node 1-2) by their corresponding switches $S_1$, $S_2$ and $S_3$, the total width would be $W_{n1}$. As the switches $S_1$, $S_2$ or $S_3$ become disabled (switched to ground), the summation of the widths of the composite devices $N_{1a}$, $N_{1b}$ and $N_{1c}$, respectively, decreases. Thus, the current $I_3=(W_{N3}/W_b)*I_1$ in the case illustrated in FIG. 2b.

Figure 3A:
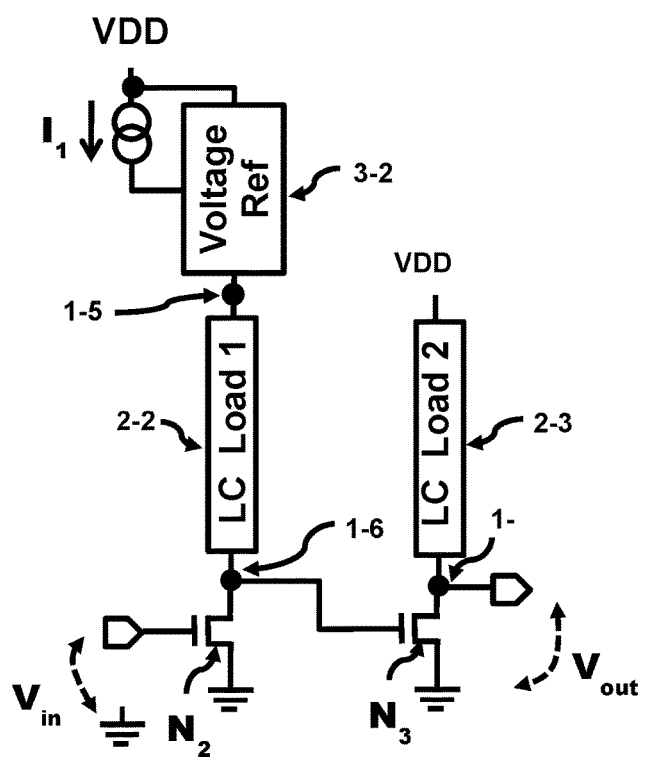
FIG. 3a depicts the one embodiment of the direct biasing technique with the additional block diagrams in accordance with the present invention.
Figure 3B:
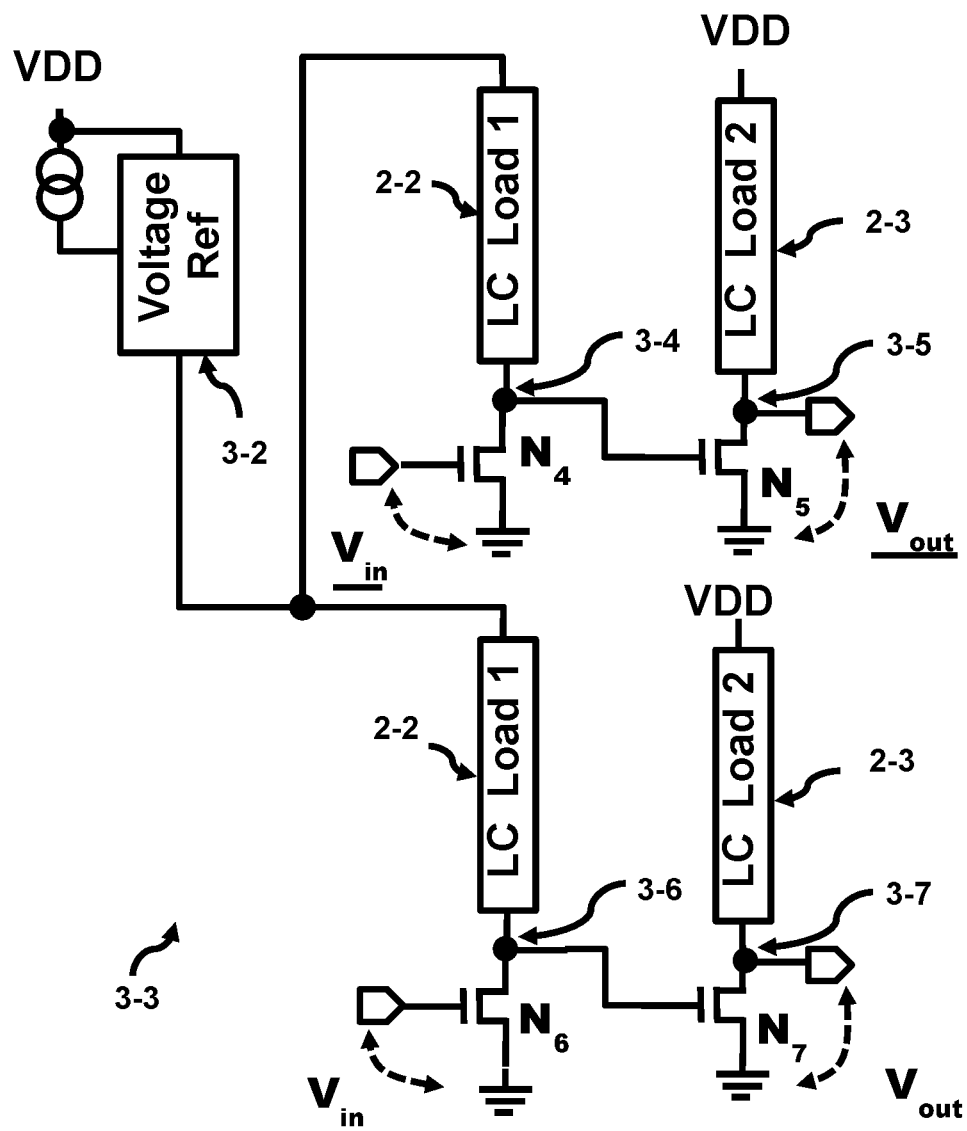
FIG. 3b depicts a third embodiment of the direct biasing technique for a balanced output driver in accordance with the present invention.

FIG. 3a depicts another simplification 3-1 to the circuit illustrated in FIG. 2a. The Voltage Ref Block 3-2 has been added to represent the operational amplifier stage 1-3, devices $N_1$ and $P_1$ and connectivity as illustrated in FIG. 2a. The biasing voltage circuit comprising of the voltage Ref 3-2 and of the current source $I_3$ generates and applies a biasing voltage at node 1-5. In addition, this voltage is used to power the device $N_2$. FIG. 3b shows an embodiment where the inventive concept has been extended to a balanced output circuit. The biasing voltage circuit applies the biasing voltage to the "LC Load1" 2-2 which then applies the biasing voltage to the nodes 3-4 and 3-6. Because "direct coupling" is utilized, the biasing voltage is directly coupled to the gates of devices $N_5$ and $N_7$, respectively. The "LC Load2" 2-3 presents a high impedance high frequency load to the devices $N_5$ and $N_7$ at the operating frequency. $V_{in}$ is applied to the gate of $N_6$ while $\overline{V_{in}}$ (180 degrees out of phase) is applied to the gate of $N_4$. The balanced output $V_{out}$ and $\overline{V_{out}}$ are available at nodes 3-7 and 3-5, respectively.

Reducing the trace lengths between the stages minimizes the overall inductance in the network. In addition, other benefits include: smaller die area, lower cost, lower power (drive less parasitic capacitance/inductance), and reduced design time. When the network of the parasitic capacitances or inductance increases, the simulation of the circuit slows down and requires a long time to evaluate. By minimizing the distance between stages, the area of the die containing the stages is decreased. As the area of the die decreases, the network of the parasitic capacitances or inductance decreases offering quicker simulation results.

Finally, it is understood that the above description are only illustrative of the principle of the current invention. Various alterations, improvements, and modifications will occur and are intended to be suggested hereby, and are within the sprit and scope of the invention. This invention may, however, be embodied in many different forms and should not be construed as limited to the embodiments set forth herein. Rather, these embodiments are provided so that the disclosure will be thorough and complete, and will fully convey the scope of the invention to those skilled in the arts. It is understood that the various embodiments of the invention, although different, are not mutually exclusive. In accordance with these principles, those skilled in the art may devise numerous modifications without departing from the spirit and scope of the invention. This inventive technique is applicable to direct biasing the high frequency design of a multi-stage circuit. The stage can have active electronics, reactive loads and resistance or any combination therein. It is a challenging layout task to minimize all parasitic inductance and capacitance between, as well within, stages in order to operate the circuit at the smallest possible area in an integrated circuit. As the area is reduced, the propagation time is also reduced. This allows the RF designer to extend the concept to even higher frequency circuits for a given technology. The LC circuit can be set to resonate at frequencies above or below 60 GHz to select other frequency bands within the allotted spectrum. At electrical resonance, the parallel LC circuit can also be called a resonant parallel LC circuit. A trace can be a metallic interconnect that couples one node to another node. Many portable wireless systems as well as non-portable systems can benefit from the inventive techniques presented here. In addition, the network and the portable system can exchange information wirelessly by using communication techniques such as TDMA (Time Division Multiple Access), FDMA (Frequency Division Multiple Access), CDMA (Code Division Multiple Access), OFDM (Orthogonal Frequency Division Multiplexing), UWB (Ultra Wide Band), WiFi, WiGig, Bluetooth, etc. The network can comprise the phone network, IP (Internet protocol) network, LAN (Local Area Network), ad hoc networks, local routers and even other portable systems.

What is claimed is:

1. An apparatus comprising:
    a first-stage transistor circuit configured to generate a high-frequency signal that is passed to a second-stage transistor circuit, the first-stage transistor circuit comprising:
    a conducting trace directly connecting the first-stage transistor circuit to the second-stage transistor circuit;
    a voltage reference circuit comprising a control loop configured to monitor a first biasing voltage and generate a second biasing voltage, wherein the first biasing voltage is a first input to an operational amplifier of the control loop and an output of the operational amplifier is coupled to a gate of a first transistor, wherein the second biasing voltage is formed across the first transistor and fed back as a second input into the operational amplifier, and wherein the operational amplifier and the first transistor form the control loop;
    a reference current source electrically coupled to a reference transistor connected in saturation, the reference current source programmable to control the voltage reference circuit configured to generate the second biasing voltage; and
    a resonant circuit configured to pass the second biasing voltage to the second-stage transistor circuit by way of the conducting trace,
    wherein the voltage reference circuit is adjustable to provide adjustment to the first biasing voltage to control the second-stage circuit's drive strength.

2. The apparatus recited in claim 1, wherein the resonant circuit is electrically coupled in series with at least one of a power lead and a ground lead.

3. The apparatus recited in claim 1, wherein the resonant circuit is configured to block the high-frequency signal from affecting power supplied to the first-stage transistor circuit.

4. The apparatus recited in claim 1, wherein the resonant circuit comprises a resonant parallel LC load.

5. The apparatus recited in claim 1, wherein the resonant circuit is configured to resonate at a predetermined frequency to provide for selection of a frequency band.

6. The apparatus recited in claim 1, wherein the reference transistor generates the first biasing voltage, the control loop is configured to equalize the second biasing voltage to the first biasing voltage, and the resonant circuit electrically couples the second biasing voltage to a gate of a second transistor in the second-stage transistor circuit.

7. The apparatus recited in claim 6, wherein the first transistor comprises a P-channel Metal Oxide Semiconductor (MOS) device or an N-channel MOS device.

8. The apparatus recited in claim 6, wherein the control loop is configured to employ at least one of a negative feedback and a positive feedback.

9. The apparatus recited in claim 6, further comprising a second resonant circuit that electrically couples a power supply to an output of the second transistor.

10. The apparatus recited in claim 9, wherein the resonant circuit and the second resonant circuit are configured to resonate at a frequency to provide for selection of a frequency band.

11. The apparatus recited in claim 1, wherein at least one of power control, current flow, and biasing of the second-stage transistor circuit are configurable by adjusting the second biasing voltage.

12. The apparatus recited in claim 1, wherein the control loop is configured to employ positive feedback through an N-channel transistor connected to the second input of the operational amplifier.

13. The apparatus recited in claim 1, wherein a current through the second transistor in the second-stage transistor circuit is scaled by an amount $M=(W_{N3}/W_{N1})$ relative to a current through the reference transistor, and wherein $W_{N3}$ is a gate width of the second transistor and $W_{N1}$ is a gate width of the reference transistor.

14. The apparatus recited in claim 13, wherein the reference transistor comprises a variable gate width that is adjustable.

15. The apparatus recited in claim 13, wherein the reference transistor comprises a plurality of devices coupled together with a plurality of switches, wherein the gate width of the reference transistor is adjustable by opening or closing at least one of the plurality of switches.

16. The apparatus recited in claim 1, wherein the conducting trace has a trace length determined by a minimum separation distance of adjacent devices in a layout.

17. The apparatus recited in claim 1, wherein the second-stage transistor circuit comprises an output connected to an antenna.

18. The apparatus recited in claim 1, configured to generate balanced output voltages.

* * * * *